(12) United States Patent
Leonardi et al.

(10) Patent No.: US 7,952,104 B2
(45) Date of Patent: May 31, 2011

(54) THIN-FILM TRANSISTOR (TFT) DEVICE

(75) Inventors: Salvatore Leonardi, Aci Sant'Antonio (IT); Claudia Caligiore, Giarre (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 12/564,719

(22) Filed: Sep. 22, 2009

(65) Prior Publication Data

US 2010/0006856 A1    Jan. 14, 2010

Related U.S. Application Data

(62) Division of application No. 11/478,332, filed on Jun. 28, 2006, now Pat. No. 7,611,933.

(30) Foreign Application Priority Data

Jul. 5, 2005 (EP) .................................... 05425477

(51) Int. Cl.
*H01L 29/04* (2006.01)
*H01L 31/036* (2006.01)

(52) U.S. Cl. ........... 257/72; 257/E21.205; 257/E21.094; 438/164; 438/592

(58) Field of Classification Search .................... 257/72, 257/E21.205, E21.094; 438/164, 166, 592
See application file for complete search history.

(56) References Cited

U.S. PATENT DOCUMENTS

| | | | |
|---|---|---|---|
| 5,689,443 A * | 11/1997 | Ramanathan | ................ 702/183 |
| 5,728,259 A | 3/1998 | Suzawa et al. | |
| 5,946,561 A | 8/1999 | Yamazaki et al. | |
| 6,281,057 B2 * | 8/2001 | Aya et al. | ..................... 438/166 |
| 6,764,886 B2 | 7/2004 | Yamazaki et al. | |
| 6,777,274 B2 * | 8/2004 | Moon et al. | .................. 438/166 |
| 6,812,492 B1 | 11/2004 | Choi | |
| 7,521,303 B2 * | 4/2009 | Paik | ............................. 438/166 |
| 2003/0061984 A1 | 4/2003 | Maekawa et al. | |
| 2004/0087125 A1 | 5/2004 | Monoe | |

OTHER PUBLICATIONS

European Search Report for European Patent Application No. EP05425477, dated Nov. 30, 2005.

Im, J.S., et al., Controlled Super-Lateral Growth of Si Film for Microstructural Manipulation and Optimization, XP002935002, Physica Status Solidi (A), Applied Research, vol. 166, pp. 603-617, 1998.

Im, J.S., et al., On the Super Lateral Growth Phenomenon Observed in Excimer Laser-Induced Crystallization of Thin Si Films, XP000676248, Applied Physics Letters, vol. 64, No. 17, pp. 2303-2305, 1994.

* cited by examiner

*Primary Examiner* — Phuc T Dang
(74) *Attorney, Agent, or Firm* — Lisa K. Jorgenson; Kevin D. Jablonski; Graybeal Jackson LLP

(57) ABSTRACT

A process for manufacturing a thin-film transistor device includes forming a dielectric insulation layer on a substrate, forming an amorphous silicon layer on the dielectric insulation layer, crystallizing the amorphous silicon layer, so as to obtain polycrystalline silicon, forming gate structures on the polycrystalline silicon, and forming first doped regions within the polycrystalline silicon laterally with respect to the gate structures. The crystallizing step includes forming first capping dielectric regions on the amorphous silicon layer, and then irradiating the amorphous silicon layer using a laser so as to form active areas of polycrystalline silicon separated by separation portions of amorphous silicon underlying the first capping dielectric regions.

17 Claims, 8 Drawing Sheets

THIN-FILM TRANSISTOR (TFT) DEVICE

PRIORITY CLAIM

This application is a Divisional of U.S. patent application Ser. No. 11/478,332, filed Jun. 28, 2006, currently pending, which claims benefit of European patent application No. 05425477.6 filed Jul. 5, 2005, all of the foregoing applications are incorporated herein by reference in their entireties.

TECHNICAL FIELD

The present invention relates to a process for manufacturing a thin-film transistor (TFT) device.

BACKGROUND

As is known, thin-film polysilicon transistors have assumed, in the field of low-temperature polysilicon (LTPS) technologies, a fundamental role in a wide range of sectors of consumer micro-electronics (such as, for example, that of active-matrix displays), mainly due to the development of laser crystallization techniques. These techniques, in fact, enable values of mobility of crystallized layers to be obtained higher than 100 cm$^2$/V·s, i.e., more than two orders of magnitude higher than that of TFT devices integrated on amorphous silicon. It has consequently become possible to obtain high levels of electrical performance, comparable with those of traditional MOS devices made on crystalline silicon, at a lower manufacturing cost, and above all with the possibility of application on a non-conventional substrate, such as, for example, a flexible substrate. However, TFT devices still have problems in terms of optimization of structure and process, in particular for applications wherein it is important to associate high densities of integration to low production costs.

A known process for manufacturing self-aligned TFT devices using ion-implantation techniques is described briefly with reference to FIGS. 1-6. For further information, see for example: Min-Cheol Lee, Min-Koo Han, IEEE Electron Device Letters, vol. 25, No. 1, January 2004.

In detail (see FIG. 1), an amorphous silicon layer 2 is initially deposited on a quartz substrate 1 using a PECVD process. Then, a step of dehydrogenation in inert environment is carried out, which enables the hydrogen accumulated in the amorphous silicon layer 2 to flow out in order to prevent any possible phenomena of micro-explosions during subsequent steps of the process. Then, the amorphous silicon layer 2 undergoes a crystallization process through irradiation with an excimer laser XeCl (represented by the arrows in FIG. 1), consequently undergoing a conversion into a polysilicon layer 2.

Next (see FIG. 2), via a reactive ion etching (RIE) of the polysilicon layer 2, active islands 2a of the TFT device are defined, which are designed for integration of the TFT transistors. A gate-oxide layer 3 (made of TEOS-TetraEthylOrthoSilicate) is then deposited using an ECR-PECVD process. The gate-oxide layer 3 acts also as insulator between contiguous active islands 2a. Then, a metallization layer 4, made of an aluminium-silicon-copper alloy, is deposited by sputtering.

Next (FIG. 3), a photolithographic process is carried out for etching of the gate-oxide layer 3 and of the metallization layer 4, which leads to the formation of gate structures 5, constituted by remaining stacked portions 3a and 4a of the aforesaid etched layers.

Through appropriate implantation masks, implantations of dopant of an N$^+$ type and P$^+$ type self-aligned to the gate structures 5 are then performed (FIG. 4) for the formation of source and drain regions of the N-channel TFT devices (the regions being designated, respectively, by the reference numbers 6a, 6b) and of source and drain regions of the P-channel TFT devices (the regions being designated, respectively, by the reference numbers 7a, 7b). In particular, each source region 6a, 7a is separated from a respective drain region 6b, 7b by a channel region 8, which is located underneath a respective gate structure 5. The implanted dopants are then activated via a laser annealing process at an energy density lower than that of the crystallization process.

Then (FIG. 5), an interlayer-oxide layer 9 is deposited using the PECVD technique and is then etched so as to define openings designed for source, drain and gate contacts of the TFT transistors.

Finally (FIG. 6), a metallization layer 10, made of an aluminium-silicon-copper alloy, is deposited and etched for the formation of source (S), drain (D) and gate (G) contacts 11.

This process sequence has some problems and disadvantages. In particular, the laser crystallization step is extremely critical in so far as it contributes to determining the final electrical characteristics of the TFT transistors. In the described process it is, however, difficult to accurately control the growth and size of the grains within the crystallized polysilicon layer. The electron mobility within the crystallized polysilicon layer can also prove insufficient for particular applications. In addition, a single gate metallization is provided for both the N-channel and the P-channel TFT transistors, and it is not possible to adjust the threshold voltage value as a function of the type of conductivity of the channel. In addition, the "cascaded" etching of the metallization layer 4 and of the gate-oxide layer 3 (FIG. 3) is particularly critical in so far as, if not suitably calibrated, it can involve the thin layer of polycrystalline silicon 2 that will define the channel of the TFT devices, thus altering the electrical specifications of the TFT devices.

SUMMARY

One aspect of the present invention is consequently to provide a process for manufacturing a TFT device that will enable the aforementioned problems to be overcome and that will enable a further improvement to be achieved for the manufacturing processes of a known type.

BRIEF DESCRIPTION OF THE DRAWINGS

For a better understanding of the present invention, preferred embodiments thereof are now described, purely by way of non-limiting example and with reference to the attached drawings, wherein.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Manufacturing processes according to embodiments of the present invention enable the integration of N-channel and P-channel TFT transistors on a substrate of a generic type, such as for example silicon, glass, or plastic.

Figure 1:
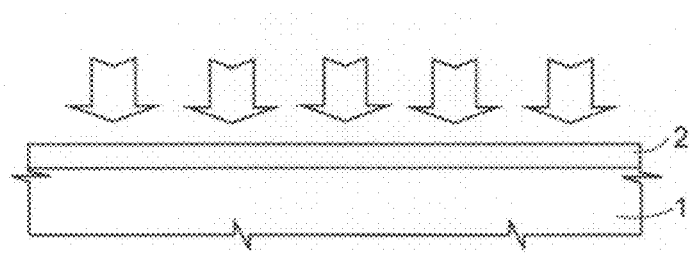
FIGS. 1-6 show cross sections through a wafer of semiconductor material in successive steps of a known process for manufacturing a TFT device.
Figure 2:
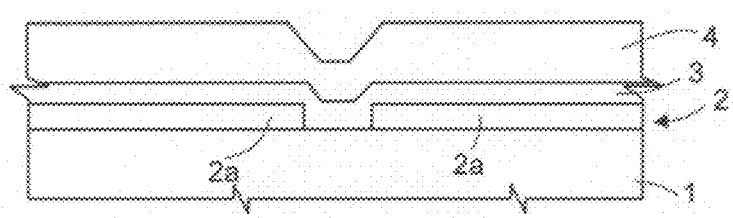
Figure 3:
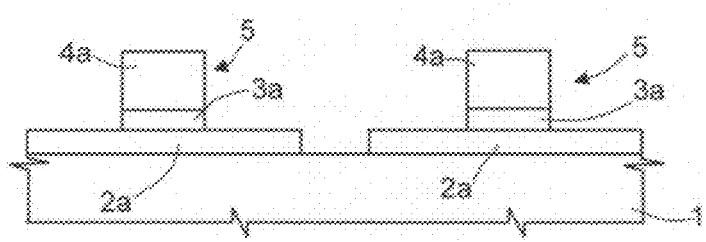
Figure 4:
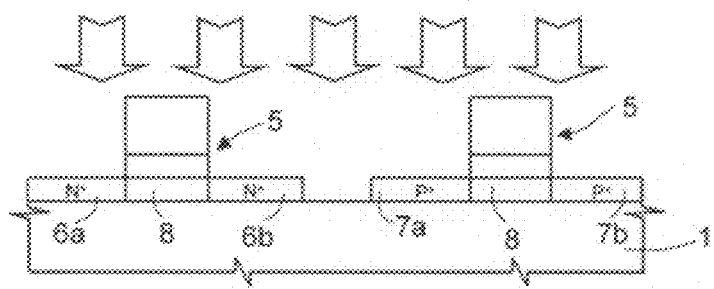
Figure 5:
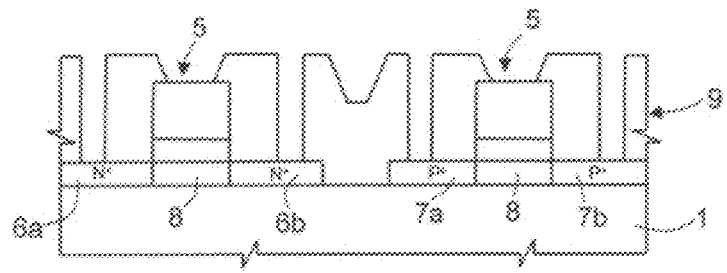
Figure 6:
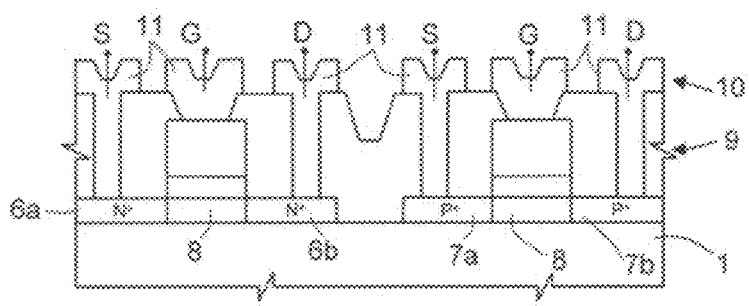
Figure 7:
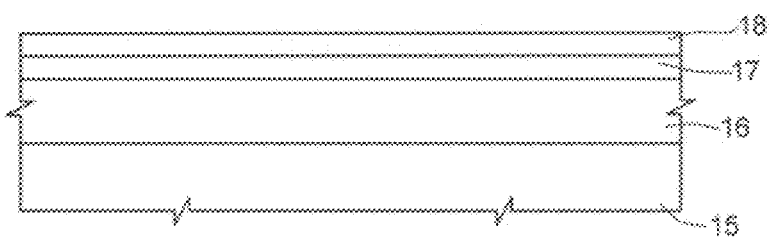
FIGS. 7-16 show cross sections through a wafer of semiconductor material in successive steps of a process for manufacturing a TFT device according to a first embodiment of the present invention.

With reference to FIG. 7 (which is not drawn to scale, as neither are all the subsequent figures), on a substrate 15 of a generic type (made, for example, of silicon, glass or plastic), a dielectric insulation layer 16 (in particular TEOS or VAPOX) is initially formed, for example via deposition. The deposition occurs at a temperature lower than the melting point of the substrate 15. Consequently, if the substrate 15 is made of plastic material, the temperature must be less than 100° C. for commercially available plastic materials, for example PEN (PolyEthylene Naphthalate, having a melting point of 150° C.), or PET (PolyEthylene Terephthalate, having melting point of 120° C.); around 300° C. for latest-generation plastic materials, such as, for example, Arylite and Polyimide; or else lower than 600° C., if the substrate 15 is made of commercially available glass. The dielectric insulation layer 16 acts as electrical and thermal insulation in regard to the substrate 15, and its thickness must be such as to prevent triggering of active or passive parasitic devices; for instance, it must be a few hundreds of nanometers.

Next, an amorphous silicon layer 17 is deposited on the dielectric insulation layer 16, once again at a temperature lower than the melting point of the substrate 15, for example using a PECVD process at a temperature close to or lower than 300° C. in the case of a flexible substrate, or more in general using an LPCVD (Low-Pressure Chemical Vapour Deposition) process at a temperature of 530° C. in the case of silicon or glass substrate. The thickness of the amorphous silicon layer 17 is in the region of a few tens of nanometers; typical values are around 100 nm. Then, a capping dielectric layer 18, for example, made of silicon oxide, is deposited on top of the amorphous silicon layer 17.

Figure 8:
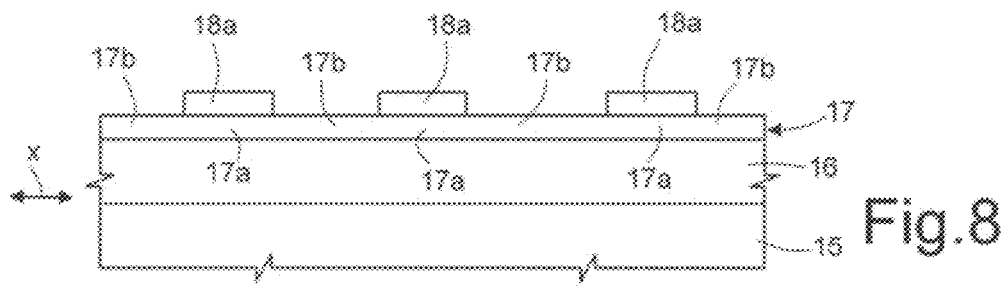

Then (FIG. 8), the capping dielectric layer 18 is patterned through an appropriate photolithographic masking and etching process, following upon which there remain capping portions 18a. In particular, the capping portions 18a cover first regions 17a of the amorphous silicon layer 17, and leave second regions 17b of the amorphous silicon layer 17 accessible. In particular, the first regions 17a separate the second regions 17b from one another. Advantageously, for reasons that will be clarified hereinafter, the second regions 17b have different lateral dimensions in the direction of the cross section of FIG. 8, designated by x.

In a per se known manner which is not described in detail, between the various process steps, cleaning operations of the contact surfaces can be carried out, having the purpose of removing any possible contaminants or undesirable particles, and a dehydrogenation step can be performed to remove any possible hydrogen atoms that may have accumulated within the amorphous silicon layer 17.

Figure 9:
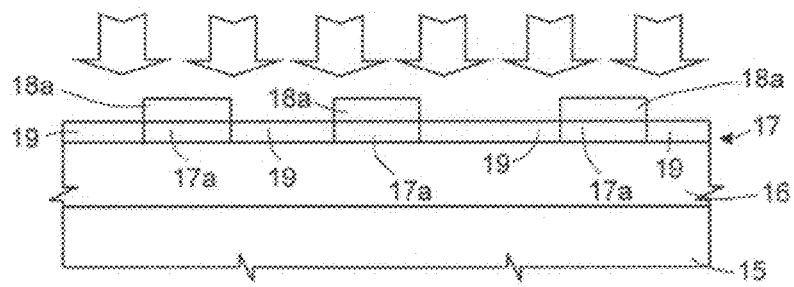

Then (FIG. 9), a crystallization process of the amorphous silicon layer 17 is carried out by irradiation with an excimer laser XeCl and the PLC (Pulsed Laser Crystallization) technique, through the previously patterned capping dielectric layer 18. The laser may, for example, be the XeCl laser Lambda Physik LPX 305i, with the following irradiation parameters: wavelength $\lambda$ of 308 nm, pulse duration $\tau$ of 28 ns, maximum pulse energy of 600 mJ.

Following upon the irradiation, the film of amorphous silicon 17 is partially converted into a film of polysilicon through a step of ultrafast melting and subsequent resolidification and formation of grains by cooling. The crystallization of the film of amorphous silicon 17 occurs in relatively short time intervals (a few tens of nanoseconds) without the substrate 15 being subjected to prolonged thermal stresses. According to an embodiment of the invention, the energy of the irradiation is selected so as to induce in the film of amorphous silicon 17 a crystallization in the so-called SLG (Super Lateral Growth) regime so as to obtain grains of the order of micrometers and values of mobility higher than a few hundreds of $cm^2/V \cdot s$. As is known, the SLG regime enables generation of grains of larger size (up to a few micrometers in diameter) as compared to other crystallization regimes (in particular, low-energy-density regime and high-energy-density regime). In detail, in the SLG regime, the film of amorphous silicon melts completely except for small islands of non-molten silicon formed at the interface with the substrate 15. Once irradiation ceases, the islands act as seed for the growth of the grains in the cooling step. When the grains, growing in an isotropic way, reach the surface, they do not stop growing, but continue to expand laterally and not randomly but rather according to a preferential direction (orientation <111>), consequently reaching considerable dimensions.

In particular, the thickness of the capping dielectric layer 18 is chosen in such a way that the capping portions 18a will present maximum reflectivity to the laser (higher than or equal to 0.6), so as to locally "block" the laser irradiation and prevent crystallization of the underlying first regions 17a of amorphous silicon. It is thus possible to obtain a lateral differentiation between areas of the amorphous silicon layer 17 that are crystallized by the laser irradiation (i.e., the second regions 17b) and areas that are not crystallized (i.e., the first regions 17a). In detail, the thickness of the capping dielectric layer 18 must be a multiple of 100 nm, for example, 100 nm, 200 nm, 300 nm, etc. At the end of the crystallization process, active polysilicon areas 19 (corresponding to the second regions 17b) are consequently formed, which are separated by the first regions 17a of amorphous silicon, which are in turn overlaid by the capping portions 18a. Advantageously, the capping portions 18a contribute, together with the first regions 17a, to the lateral insulation between the active polysilicon areas 19, in which, as explained hereinafter, the TFT circuitry, as likewise further active or passive components, will be integrated. Advantageously, since the extension of the second regions 17b is different in the preferential direction x of SLG growth of the polysilicon grains, given a same energy of laser irradiation, the growth of the polysilicon grains is differentiated in the direction within the various active polysilicon areas 19 (not in the vertical direction, on account of the constraint set by the thickness of the amorphous silicon layer 17). In practice, with a single irradiation process, active polysilicon areas 19 are obtained having properties that are different in terms of extension and growth of the polysilicon grains.

Figure 10:
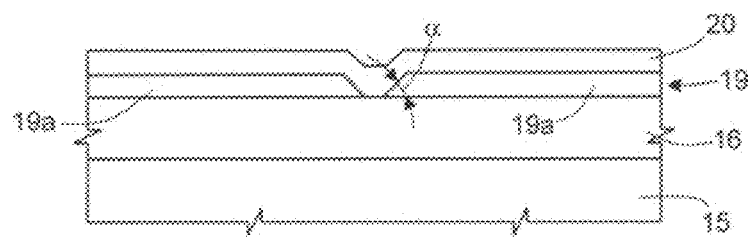

Then (FIG. 10), via an appropriate photolithographic and etching process, within each of the active polysilicon areas 19, integration islands 19a are defined, wherein N-channel or P-channel TFT transistors will be integrated. It should be noted that this and all the subsequent steps of the process are described with illustration of just one of the active polysilicon areas 19. It is, however, understood that similar steps simultaneously affect all the previously formed active polysilicon areas 19. In particular, according to an embodiment of the present invention a dry etching is performed, which causes the edge of the integration islands 19a to have an angle α smaller than 90°, preferably smaller than or equal to 45°, with respect to a surface of separation with the dielectric insulation layer 16. Such an angle is particularly advantageous for reducing the so-called "point effect", i.e., the presence of high electric fields in the proximity of regions with sharp edges, and consequently for preventing premature breakdown phenomena of a dielectric that will be formed over the integration islands 19a. Then, a gate dielectric layer 20 (made, for example, of silicon oxide) is deposited on the integration islands 19a, having a thickness of about 100 nm, and intended to form the gate dielectric of the TFT transistors.

Next (FIG. 11), a high-dose ion implantation of an $N^+$ type or else of a $P^+$ type is performed through a mask 21, having the purpose of providing one or more heavily doped regions 22 within one or more of the integration islands 19a. In detail, the heavily doped regions 22 can act as bottom plate of a capacitor, the top plate of which will be made with one of the subsequent layers still to be integrated, or else they can constitute the body of a resistor, which will then be completed with appropriate metallization layers, or they can constitute one of the regions of a lateral diode, which will be opposed in junction to a region with low level of doping of the opposite type (formed as will be described in what follows), or more in general, they may form generic active or passive components that are to be integrated together with the TFT transistors. Advantageously, the gate dielectric layer 20 can act as pre-implantation dielectric for the dopant species, of an $N^+$ type or a $P^+$ type, so as to appropriately calibrate the aforesaid ion implantation.

Figure 12:
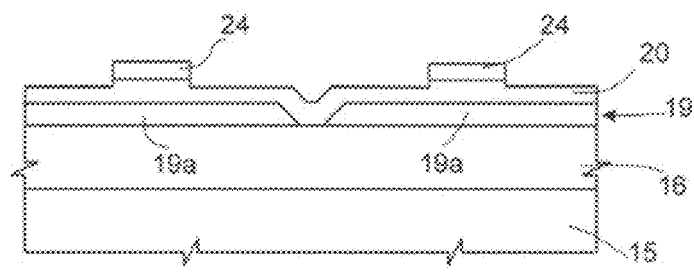

Then (FIG. 12), a conductive layer is deposited having the thickness of some hundreds of nanometers, and in any case having a thickness such as to prevent the dopant atoms, during subsequent processes of laser annealing, from doping the underlying polysilicon region. Next, a photolithographic process is carried out, followed by an etching process, preferably a dry etch for the purposes of a fine dimensions control, which leads to the definition of gate regions 24, one on top of each integration island 19a. In particular, the etching, even if selective with respect to the gate dielectric layer 20, entails, however, a slight reduction in its thickness. The gate regions 24 are made, for example, of an aluminium-silicon-copper alloy, or else, advantageously, are made of polysilicon, either intrinsic or else doped in situ with an N-type or a P-type doping. The polysilicon layer from which the gate regions 24 are obtained is in this case deposited via a LPCVD process at a temperature of 530° C. in an environment of $SiH_4/PH_3$ or $SiH_4/B_2H_6$ respectively, according to the type of TFT transistors to be formed. If the substrate 15 is a glass substrate, the polysilicon layer can be deposited using the PECVD technique at a temperature of around 400° C., whereas, if the substrate 15 is of a plastic material, the deposition of the polysilicon layer can be performed using the ECR-CVD technique.

Figure 13:
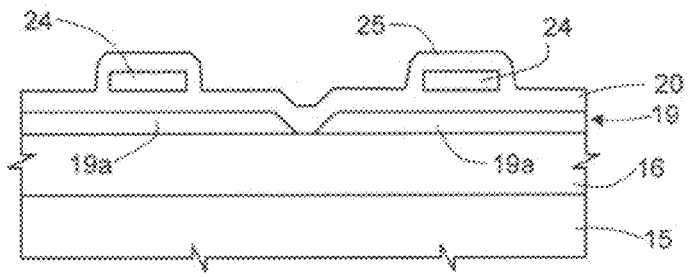

Next (FIG. 13), a pre-implantation dielectric layer 25 is deposited, which joins to the gate dielectric layer 20 and has a thickness appropriately sized so as to be used as pre-implantation dielectric for all or some of the subsequent ion implantations. In particular, the pre-implantation dielectric layer 25 forms a spacer region (in what follows also referred to simply as spacer) around the gate regions 24. The spacer region could prevent the dopant, during subsequent implantation steps and according to the thickness of the deposited dielectric material, from reaching the underlying polysilicon and hence creating series resistances to the channel regions of the TFT device (underlying the gate regions 24). It should be noted, however, that the nominal thickness of the pre-implantation dielectric layer 25 is rather small, around 100 nm if measured along the surface, and of a smaller value along the vertical walls of the gate regions 24, on account of a thinning intrinsic to the deposition process. Advantageously, the thickness is in any case of the same order of magnitude as the tolerances of the lateral "straggling" associated with the specifications of subsequent implantations and hence such as to be totally compensated for. In practice, the process is such as in any case to eliminate any possible series resistance to the channel. If, however, it were necessary, there could be envisaged the use of appropriate angle implantations.

Figure 14:
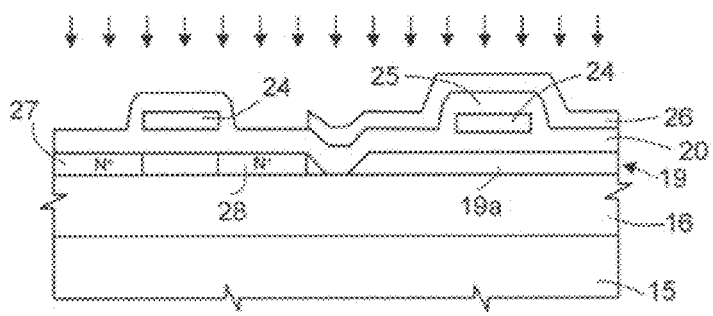
Figure 15:
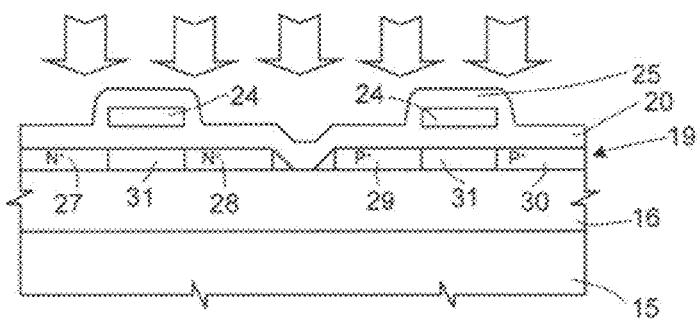

At this point (FIG. 14), implantation processes are carried out for formation of source and drain regions of an $N^+$ type and $P^+$ type, respectively of the N-channel and P-channel TFT transistors, in a way self-aligned to the gate regions 24. There is thus formed an appropriate mask 26, which delimits the regions to be implanted, and implantation of an $N^+$ type is then carried out to obtain the source and drain regions of an $N^+$ type 27, 28. Advantageously, the same implantation performs doping of the gate regions 24 of the N-channel TFT transistors (should they be made of polysilicon) and can provide heavily doped regions 22 of capacitors, resistors, or diodes (in this case it will not be necessary to envisage the dedicated step shown in FIG. 11). Adopting a similar photolithographic and implantation process, source and drain regions of a $P^+$ type 29, 30 are made (FIG. 15). The portion of the integration island 19a underlying the gate region 24 and set between a source region and a respective drain region forms the channel region 31 of the TFT transistors. In detail, the dosages of these implants are of the order of $10^{14}$ to $10^{15}$ atoms/cm$^2$, whilst the implantation energy is of the order of a few tens of keV.

Next, an annealing step is carried out, which activates the previously implanted dopants. Advantageously, annealing is performed using a laser, particularly in the case of substrates having low melting points. In fact, the laser heats only the surface region, at high temperatures but for short times, preventing the substrate 15, which is thermally insulated by the dielectric insulation layer 16 deposited in the initial step of the process, from reaching high temperatures. For the same reason, annealing of the dopant regions in the proximity of the channel region 31, particularly if the spacer regions are provided, could prove to be not very efficient. In the dopant implantation step, the lateral "straggling" profile is consequently optimized so as to optimize the subsequent annealing step. In addition, should the gate region 24 be made of metal material, the laser annealing process does not entail any problem in so far as, if the metal has an appropriate thickness, it reflects the annealing radiation towards the surface, thus preventing an excessive heating of the metal region beyond the melting point. Should, instead, the gate region 24 be made of polysilicon, advantageously the laser process activates the dopant thereof (whether it has been formed in situ or it has been previously implanted) simultaneously to dopant activation of the source and drain regions. Alternatively, and for substrates for which this is possible (for example, glass substrates), the process of dopant activation can be performed in an oven at a low temperature, for example lower than 600° C., for a few hours.

Figure 16:
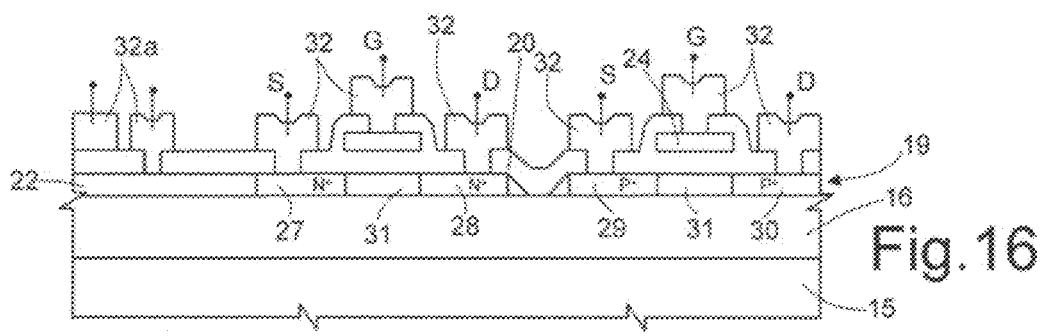

Then (FIG. 16), via a further photolithographic process and a subsequent etching, preferably a wet etching, openings are defined within the pre-implantation and gate dielectric layers 25, 20, and then (for example, via a process of sputtering of aluminium-silicon-copper alloys) electrical contacts 32 of source, drain, gate (designated by S, D, G in FIG. 16) are formed within the openings, and the necessary metallization paths (not shown) for connection to the remaining circuitry are made. In particular, in this step electrical contacts 32a for the heavily doped regions 22 of the active or passive components previously obtained are also formed (in FIG. 16, by way of example, the case of a capacitor is shown).

A second embodiment of the present invention envisages the formation of LDD (Lightly Doped Drain) structures, integrated within the TFT devices.

Figure 17:
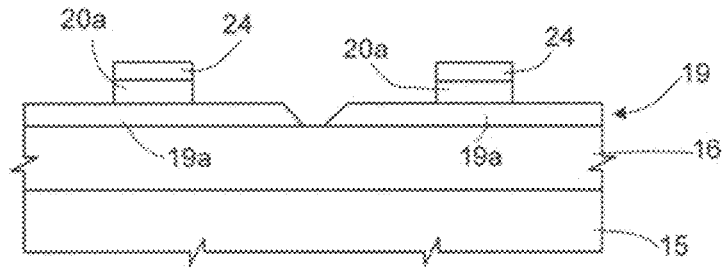
FIGS. 17-22 show cross sections through a wafer of semiconductor material in successive steps of a process for manufacturing a TFT device in accordance with a second embodiment of the present invention.

The initial process steps are in this case similar to the ones described previously, up to the definition (FIG. 12) of the gate regions 24. In this case, however (see FIG. 17), the gate dielectric layer 20 is removed (even only partially) in a selective way with respect to the gate regions 24 and outside the regions, prior to the implantation of the source and drain regions. At the end of the removal, only gate dielectric portions 20a remain.

Figure 18:
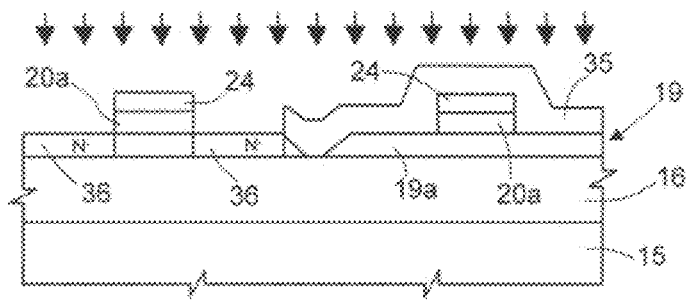
Figure 19:
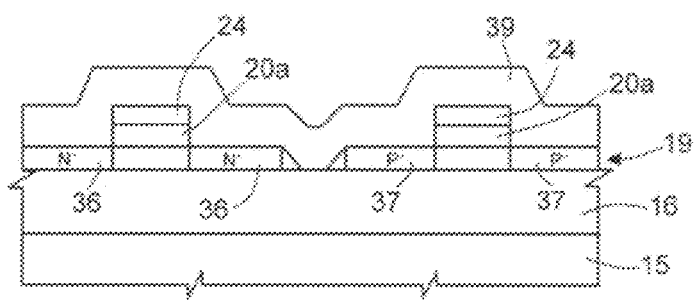

At this point (FIG. 18), an LDD etching mask 35 is formed, defining regions dedicated to integration of light implantations of an $N^-$ type, and an implantation of an $N^-$ type (with a dose of less than $10^{13}$ atoms/cm$^2$) is then carried out so as to form $N^-$ LDD regions 36 laterally with respect to the gate regions 24 of the N-channel TFT transistors, in a way self-aligned to the gate regions 24. Likewise, $P^-$ LDD regions 37 are formed (FIG. 19). The two steps are clearly interchangeable in the process sequence, and it is irrelevant which one of the $P^-$ implantation and the $N^-$ implantation is carried out first. Advantageously, by means of the same implantations lightly doped regions of other integrated components, for example lateral diodes, can be obtained.

Figure 20:
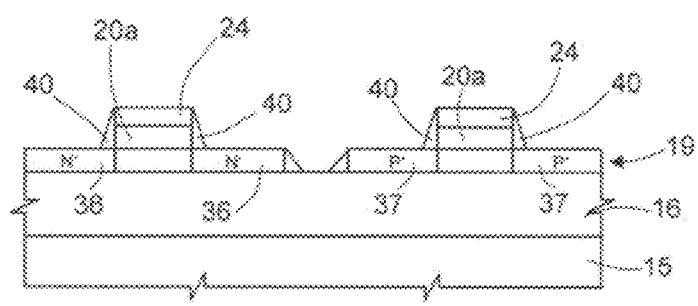

Once the LDD regions have been formed, spacer structures are made, having the function of submicrometric self-aligned implantation masks. For the purpose, a spacer layer 39 is deposited (made, for example, of dielectric material) having an appropriate thickness, which is equal at least to the sum of the thickness of the gate dielectric portions 20a and the thickness of the gate regions 24, and then a dry etching of the spacer layer 39 is carried out to provide spacer structures 40 around the gate regions 24 (FIG. 20).

Figure 21:
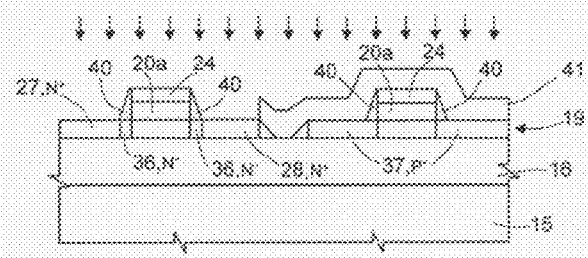
Figure 22:
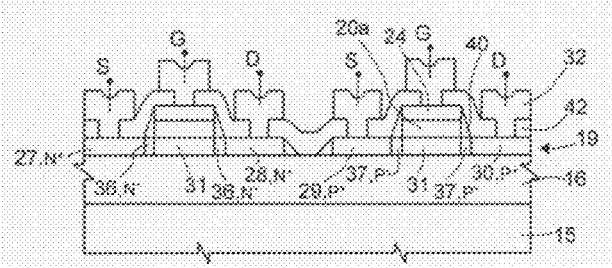

Then (FIG. 21), a heavy etching mask 41 is formed, and a $N^+$ type implantation process is performed to provide the source and drain regions of an $N^+$ type 27, 28. Next, the procedure is repeated to obtain the source and drain regions of a $P^+$ type 29, 30 (FIG. 22). In particular, the aforesaid implantations are made in a way self-aligned to the spacer structures 40, preventing the dopant from reaching the underlying LDD regions. Consequently, in the proximity of the channel regions 31 of the N-channel and P-channel TFT transistors, the heavily doped source/drain regions do not overlie the lightly doped LDD regions. As is known, the presence of LDD regions in the proximity of the channel regions is particularly advantageous in so far as it enables a reduction of the electric field at the drain regions in the biasing condition, and hence improvement of the electrical performance of the TFT devices. The size of the spacer structures 40 can be modified by adjusting the thickness of the gate dielectric layer 20, the gate regions 24, and the spacer layer 39.

An annealing step is then performed for dopant activation, and a dielectric insulation layer 42 is formed on the integration islands 19a, having the function of electrically insulating the integration islands 19a from one another. Next, the source, drain and gate electrical contacts 32 and the electrical contacts 32a for the possible active or passive components are defined.

In particular, it should be noted that the process described above is totally self-aligned both as regards the source and drain implantations and as regards the LDD implantations.

Figure 23:
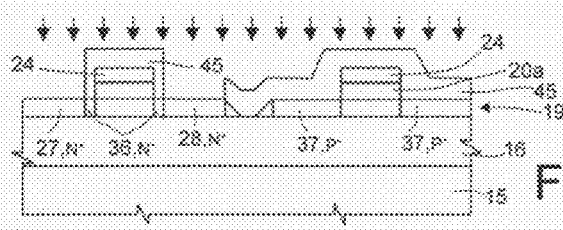
FIG. 23 shows a cross section of a wafer of semiconductor material in a step of a process for manufacturing a TFT device according to a third embodiment of the present invention.

According to a third embodiment of the present invention (FIG. 23), the LDD structures within the integration islands 19a are instead formed without resorting to the use of spacers.

In particular, after implanting the $N^-$ and $P^-$ LDD regions 36, 37 as described previously, an appropriate implantation mask 45 is defined, which covers not only the regions of the TFT device designed for integration of P-channel transistors, but also the gate regions 24 of the N-channel TFT transistors and the $N^-$ LDD regions 36. A high dose ion implantation of an $N^+$ type is then performed so as to provide the source and drain regions of an $N^+$ type 27, 28. In this case, it is the implantation mask 45 that protects the $N^-$ LDD regions 36 from the high-dose implantation, and the source and drain regions of an $N^+$ type 27, 28 are made in a way that is not self-aligned. A similar approach is followed for integration of the P-channel TFT transistors. It should be noted that, if the gate regions 24 are made of intrinsic polysilicon, doping of the polysilicon must be carried out in situ or else once again via implantation, but only after opening a gap in the implantation mask 45 in a position corresponding to the gate regions 24.

Figure 24:
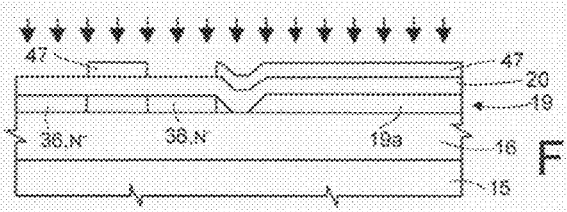
FIGS. 24-26 show cross sections through a wafer of semiconductor material in successive steps of a process for manufacturing a TFT device according to a fourth embodiment of the present invention.

A fourth embodiment of the present invention (FIGS. 24-26) envisages the manufacturing of TFT integrated devices, in a partially self-aligned way or in an entirely non-self-aligned way.

Figure 11:
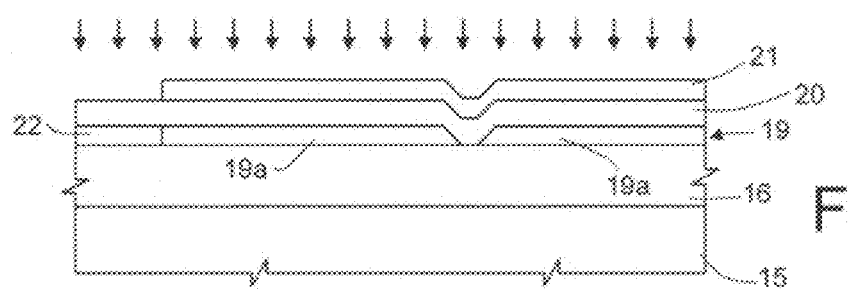
Figure 25:
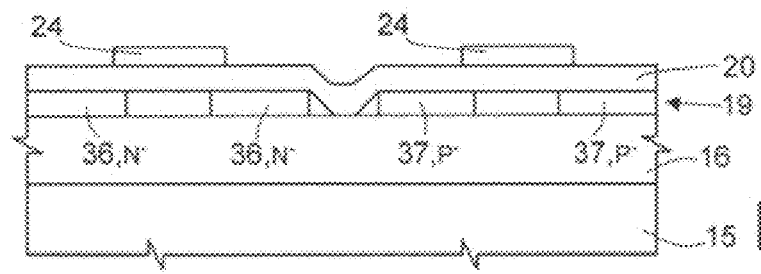
Figure 26:
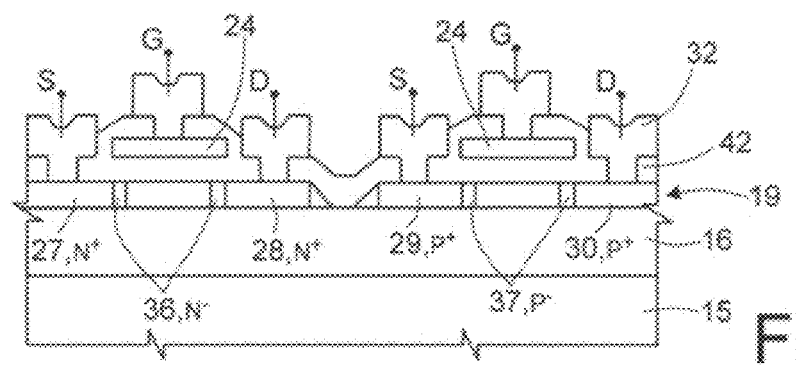

In particular, the manufacturing process proceeds in a way similar to what has been described previously up to deposition of the gate dielectric layer 20 and formation of possible heavily doped regions 22 for active or passive components (FIG. 11). Then (FIG. 24), an appropriate implantation mask 47 is defined, and the $N^-$ LDD regions 36 are formed by implantation prior to definition of the gate regions 24. In a similar way, the $P^-$ LDD regions 37 are formed (FIG. 25).

Then, a conductive layer (for example, an aluminium-silicon-copper alloy, or other material, for example polysilicon) is deposited having the thickness of a few tens of nanometers, and the gate regions 24 are defined (FIG. 25), via an appropriate photolithographic process followed by an etching process, either dry or wet according to the micrometric precision required. In particular, to prevent channel regions from being non-contiguous to the LDD regions, the width of the gate regions 24 is defined in such a way that they will partially overlap the LDD regions. In this way, the process sequence enables provision of TFT devices of a GOLDD (Gate Overlapped Lightly Doped Drain) type. In particular, the overlapping of the gate regions 24 with respect to the LDD regions considerably reduces the drawback of transconductance degradation of the TFT devices induced by the series resistance associated to the LDD regions.

At this point (FIG. 26), the source and drain regions of an $N^+$ type 27 and 28 and of a $P^+$ type 29 and 30 are formed via appropriate photolithographic and implantation processes self-aligned to the gate regions 24. The process sequence is then completed in a way similar to what has been previously described, i.e., with deposition of the dielectric insulation layer 42 and definition of the electrical contacts 32, 32*a*.

Figure 27:
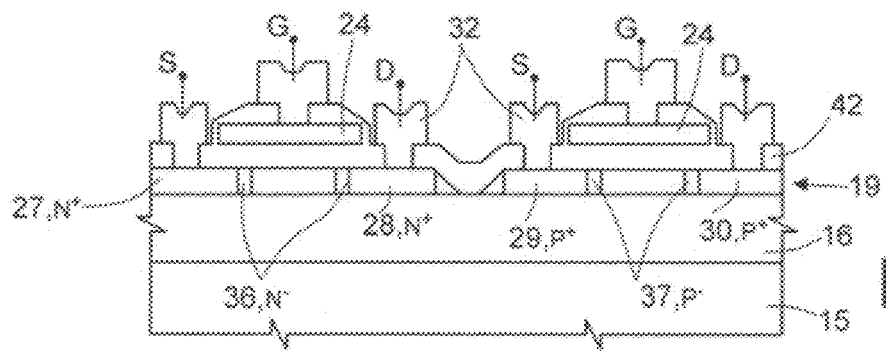
FIGS. 27-30 show variants of steps of manufacturing processes according to embodiments of the present invention.

A variation of the above process sequence (FIG. 27), envisages formation of totally non-self-aligned TFT devices. In this case, starting from the structure described in FIG. 24 the heavily doped source and drain regions are obtained via an implantation through a further implantation mask (not illustrated), and only then the gate regions 24 are formed. Advantageously, the gate regions 24 completely overlap the LDD regions and partially overlap the heavily doped source and drain regions 27 and 28, according to the compromise between static electrical performance and dynamic electrical performance of the TFT device. The overlapping of the source and drain regions by the gate regions 24, in fact, on the one hand improves the static performance, but on the other tends to worsen the dynamic performance on account of the increase in the gate-drain and gate-source overlapping capacitances. It should be noted that in this structure the heavy doping does not affect the gate regions 24, which are formed after the formation of the source and drain regions. In addition, in this case, both the LDD implantations and the heavy-doping implantations are performed in a non-self-aligned way through respective implantation masks.

The described process for manufacturing a thin-film transistor has a plurality of advantages, and can be advantageously used for obtaining TFT devices in LTPS (Low-Temperature PolySilicon) technology for applications in active-matrix (AM) displays. Not all embodiments of the present invention need necessarily include all such advantages and accordingly, the appended claims each not include such advantages.

First, the above process enables provision of active polysilicon areas 19, wherein TFT transistors and possibly active or passive components are integrated, the active areas having different properties of extension/growth of the polysilicon grains, given a same energy of the laser irradiation for the crystallization process. In fact, the definition of an appropriate pattern in the capping dielectric layer 18, prior to crystallization, enables generation of polysilicon areas of different lateral extension, which for this reason have a different lateral growth of the polysilicon grains during the subsequent process of crystallization in SLG regime. This is particularly advantageous in so far as, in one and the same silicon wafer and with a single process of laser crystallization, it is possible to provide TFT transistors with different electrical properties. The remaining non-crystallized areas of amorphous silicon overlaid by the remaining capping portions 18*a* of the capping dielectric layer 18 have the purpose of further insulating the active polysilicon areas 19 from one another.

In addition, the etching leading to formation of the integration islands 19*a* with edges having an angle smaller than or equal to 45°, enables important advantages to be achieved in terms of reduction of breakdown phenomena.

The process sequence enables provision of active or passive integrated components (for example, resistors, capacitors, diodes), simultaneously with TFT components. In particular, the presence of the capacitors is advantageous for the modalities of pixel row-column refresh in applications that envisage display driving.

In addition, the formation of polysilicon gate regions 24 enables modulation of the threshold voltage of the TFT transistors as a function of the type of channel conductivity. In fact, the gate regions 24 undergo in this case the same doping process as the respective source/drain regions.

The formation of spacer regions enables integration of different types of TFT devices, for example of an LDD type, or GOLDD type, and hence a great process versatility can be achieved. In particular, the presence of LDD regions enables a greater graduality of the lateral doping to the advantage of a reduction in the gradient of the electric field and a consequent reduction in the dimensions of the channel and in the area occupation of the TFT devices.

Particularly advantageous is the use of a pre-implantation dielectric layer to calibrate the projected range of the implanted species (for the formation of the source and drain regions, of an N$^+$ type and P$^+$ type, or for the formation of the heavily doped regions 22), as a function of the thickness of the dielectric, the implantation energy, the implantation dose and the implanted species.

In particular, due to deposition of the pre-implantation dielectric layer 25, in the case of gate regions 24 made of intrinsic polysilicon, the implantation for both the source/drain region formation and the gate regions doping encounter the same pre-implantation thickness; this enables, if requirements of planarity of the structure so demand, the thickness of the gate regions 24 to be close to that of the polysilicon layer.

In addition, the process described can be advantageously applied to substrates of a generic type.

Finally, it is clear that modifications and variations can be made to what is described and illustrated herein, without thereby departing from the scope of the present invention, as defined in the appended claims.

Figure 28:
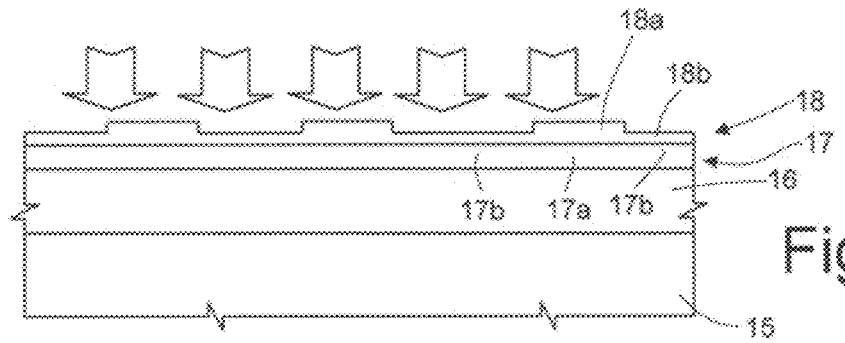
Figure 29:
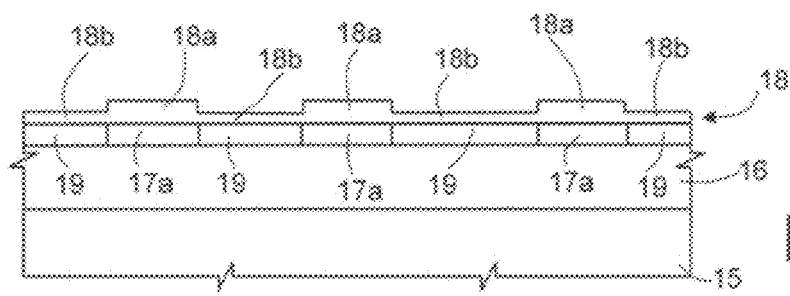
Figure 30:
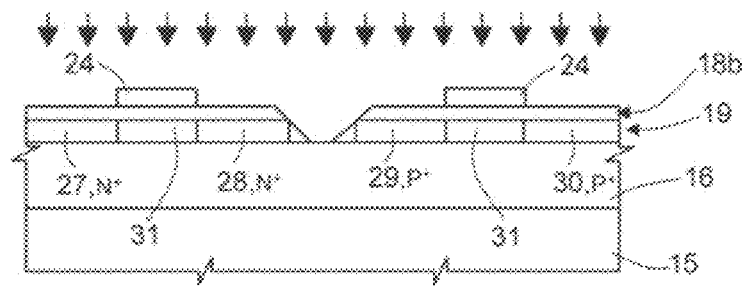

In particular (FIGS. 28-30), the capping dielectric layer 18 can be etched and patterned in a different manner in order to define the capping portions 18*a* on the first regions 17*a* so that they have a first thickness, such as to present maximum reflectivity to the laser beam (as described previously), and simultaneously buffer portions 18*b* on top of the second regions 17*b* so that they have a second thickness. In detail, the second thickness is such as to have minimum reflectivity to the laser beam (smaller than or equal to 0.3), i.e., such as to be almost "transparent" to the laser beam, and must for example be equal to a multiple of 50 nm, for example 50 nm, 100 nm, 150 nm, etc. Accordingly, in a way similar to what has been previously described, it is possible to obtain crystallization of the second regions 17*b* of the amorphous silicon layer 17 so as to form the active polysilicon areas 19 (FIG. 29). However, crystallization occurs through the buffer portions 18*b*, with the advantage of being able to control and modulate in a precise way the amount of energy to be delivered onto the film of amorphous silicon, and hence to manage in an optimal manner the crystallization process thereof in SLG regime. The buffer portions 18*b* (FIG. 30) can then be maintained on the active polysilicon areas 19 and be used as gate dielectric layer of the TFT transistors or as part of the gate dielectric layer. As described previously, the same buffer portions 18*b* can then be used as pre-implantation dielectric through which the implantations of an N$^+$ type or of a P$^+$ type 27-30 can be performed (as shown in FIG. 30), after appropriate etching of the polysilicon to define the integration islands 19*a*.

The capping portions 18*a* could be removed following upon the crystallization process and upon formation of the active polysilicon areas 19.

Advantageously, the crystallization step can be performed at a later moment of the manufacturing process, when the TFT transistors have already been defined (i.e., the gate regions 24 have already been formed, and the source and drain implantations, and possibly the LDD implantations and those of active or passive components, have already been performed). In this case, crystallization occurs on the integration islands 19*a* that have already been defined, and annealing for the activation of the implanted dopants can also be carried out with a single process of laser irradiation. Clearly, the step of definition of the integration islands 19*a* can possibly be performed after the step of crystallization/annealing via laser. If the laser irradiation simultaneously performs crystallization and annealing, a further advantage of carrying out irradiation through the buffer portions 18b is that of preventing intrinsic areas or lightly doped areas (for example LDD regions) from undergoing an undesirable doping due to the dopant atoms that are removed by the laser beam from the heavily doped areas.

In addition, the etching step that leads to definition of the integration islands 19a can be performed in an initial step of the manufacturing process, prior to deposition of the capping dielectric layer 18.

The step of laser irradiation for crystallization (and possible simultaneous annealing) can be performed through the gate dielectric layer 20, or else, if the gate dielectric layer 20 is removed outside the gate area of the TFT transistors, irradiation can advantageously be performed through a possible further pre-implantation dielectric layer which can conveniently be deposited in a step preceding that of irradiation.

In addition, as described previously, all the ion implantations subsequent to the step of gate definition can be performed with or without a pre-implantation dielectric layer according to the specifications of energy, dose, or implanted species. In particular, the pre-implantation dielectric layer can be constituted by the buffer portions 18b of the capping dielectric layer 18, by the gate dielectric layer 20, or by a dedicated dielectric layer.

The photolithographic process for obtaining the heavily doped regions 22 (see FIG. 11, for example), including implantation, can be performed prior to deposition of the gate dielectric layer 20 as a function of the energy and of the dopant species used, even prior to the crystallization step, which may in this case also have the function of annealing for activation of the corresponding dopant.

In addition, a further variant of the fourth embodiment described (not shown) envisages a totally non-self-aligned process sequence. In particular, the amorphous silicon layer 17 is first deposited, then a dielectric layer is deposited, which acts as pre-implantation layer, and, via appropriate photolithographic and implantation processes, there are obtained in succession the heavily doped regions 22, the $N^-$ and $P^-$ LDD regions 36, 37, and the heavily doped source and drain regions 27-30. The sequence in which the photolithographic and implantation processes are carried out does not constitute a constraint for the purposes of the final structure, and the processes are interchangeable, both with respect to one another and with respect to the pre-implantation dielectric, as a function of the energy, the dose and the dopant species. Also in this case, the process of laser irradiation for crystallization and annealing is carried out. The structure is then completed with the definition of the gate regions 24 and of the electrical contacts 32, 32a. As may be readily understood, the non-self-aligned process sequence is very simple as well as versatile for any type of integration. It is moreover obvious that other variations of the process can be adopted combining self-aligned process steps with non-self-aligned process steps.

Finally, the process for formation of the spacer structures 40 can possibly be reiterated, even with the deposition of different material, so as to guarantee mutual selectivity in the step of definition by means of etching. In this way, the lateral doping of the active region of the device can be defined in a still more gradual manner, providing a number of adjacent LDD regions with levels of doping increasing in the direction of the source and drain regions, to the advantage of a reduction in the gradient of potential and hence in the leakage current. The LDD regions can be formed also in a partially self-aligned way Electronic Devices including TFTs formed according to embodiments of the present invention may be utilized in active matrix displays for laptop and desk top computers and other types of electronic devices as well.

From the foregoing it will be appreciated that, although specific embodiments of the invention have been described herein for purposes of illustration, various modifications may be made without deviating from the spirit and scope of the invention.

The invention claimed is:

1. A thin-film transistor device comprising:
a dielectric insulation layer on a substrate;
active areas of polycrystalline silicon arranged on said dielectric insulation layer;
gate structures arranged on said active areas; and
first doped regions within said active areas, arranged laterally with respect to said gate structures;
characterized in that said active areas are separated from one another by separation portions of amorphous silicon, each separation portion being surmounted by a region of dielectric material; said active areas of polycrystalline silicon having different lateral lengths in a direction of separation.

2. The thin-film transistor device of claim 1 wherein the first doped regions comprise regions doped with a N-type doping.

3. The thin-film transistor device of claim 1 wherein the first doped regions comprise regions doped with a P-type doping.

4. The thin-film transistor device of claim 1 wherein the first and second doped regions in the active regions are implanted with a doping dosage comprising a concentration on the order of $10^{14}$ atoms/cm$^2$.

5. A thin-film transistor device comprising:
a dielectric insulation layer on a substrate;
active areas of polycrystalline silicon arranged on said dielectric insulation layer;
gate structures arranged on said active areas; and
first doped regions within said active areas, arranged laterally with respect to said gate structures;
characterized in that said active areas are separated from one another by separation portions of amorphous silicon, each separation portion being surmounted by a region of dielectric material; said active areas of polycrystalline silicon having different lateral lengths in a direction of separation; and
wherein said active areas comprise integration islands having edges inclined by an angle of less than 90°, in particular not greater than 45°, with respect to a surface of separation with said dielectric insulation layer.

6. A thin-film transistor device, comprising:
a substrate;
active regions of polycrystalline silicon disposed on the substrate;
gate structures on the active regions;
first and second doped regions in the active regions; and
separation regions of amorphous silicon disposed on the substrate between adjacent active regions of polycrystalline silicon.

7. The thin-film transistor device of claim 6 wherein each separation region includes a dielectric layer on the separation region.

8. The thin-film transistor of claim 6 wherein at least some the active regions have different dimensions in at least one direction of separation defined between adjacent active regions.

9. The thin-film transistor device of claim 6 wherein the substrate comprises a first base layer and a dielectric layer formed on first base layer.

10. The thin-film transistor device of claim 6 wherein the active regions have edges inclined at an angle of less than 90.

11. The thin-film transistor device of claim 6 wherein the first doped regions in the active regions are implanted with a doping dosage comprising a concentration on the order of $10^{14}$ atoms/cm$^2$.

12. The thin-film transistor device of claim 6 wherein the active regions of polycrystalline silicon comprise a thickness of approximately 100 nm.

13. The thin-film transistor device of claim 6 wherein the active regions of polycrystalline silicon comprise a crystallization having grains of the order of $10^1$ micrometers.

14. The thin-film transistor device of claim 6 wherein the active regions of polycrystalline silicon comprise a crystallization having values of mobility on the order of $10^2$ cm2/V·s.

15. An electronic system, comprising:
    an electronic subsystem including a thin-film transistor device, the thin-film transistor device comprising,
    a substrate;
    active regions of polycrystalline silicon disposed on the substrate;
    gate structures on the active regions;
    first and second doped regions in the active regions; and
    separation regions of amorphous silicon disposed on the substrate between adjacent active regions of polycrystalline silicon.

16. The electronic system of claim 15 wherein the electronic subsystem comprises an active-matrix display.

17. The electronic system of claim 15 further comprising a laptop computer containing the active-matrix display.

* * * * *